US009359195B2

(12) United States Patent
Mardilovich et al.

(10) Patent No.: US 9,359,195 B2
(45) Date of Patent: *Jun. 7, 2016

(54) METHOD OF FORMING A NANO-STRUCTURE

(75) Inventors: Peter Mardilovich, Corvallis, OR (US); Qingqiao Wei, Corvallis, OR (US); Anthony M. Fuller, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 13/822,075

(22) PCT Filed: Oct. 21, 2010

(86) PCT No.: PCT/US2010/053572
§ 371 (c)(1),
(2), (4) Date: Mar. 11, 2013

(87) PCT Pub. No.: WO2012/054042
PCT Pub. Date: Apr. 26, 2012

(65) Prior Publication Data
US 2013/0171418 A1 Jul. 4, 2013

(51) Int. Cl.
*B81C 1/00* (2006.01)
*C25D 1/00* (2006.01)
(Continued)

(52) U.S. Cl.
CPC ......... *B81C 1/00373* (2013.01); *B81C 1/00031* (2013.01); *C25D 1/006* (2013.01);
(Continued)

(58) Field of Classification Search
CPC .. B81B 2201/0214; C25D 1/00; C25D 1/003; C25D 1/006; C25D 1/02; C25D 1/04; C25D 11/045
USPC .................................................. 977/957, 958
See application file for complete search history.

(56) References Cited

U.S. PATENT DOCUMENTS 5,581,091 A * 12/1996 Moskovits ............. B82Y 10/00
205/153
6,359,288 B1   3/2002 Ying et al.
(Continued)

FOREIGN PATENT DOCUMENTS

CA        2137013      11/1994
CN      101255588 A    9/2008
(Continued)

OTHER PUBLICATIONS

Mozalev et al., "Structure, Morphology, and Dielectric Properties of Nanocomposite Oxide Films Formed by Anodizing of Sputter-Deposited Ta—Al Bilayers", Journal of the Electrochemical Society, 151, F257-F268, 2004.*
(Continued)

*Primary Examiner* — Aaron Austin
*Assistant Examiner* — Zheren J Yang
(74) *Attorney, Agent, or Firm* — Dierker & Associates, P.C.

(57) ABSTRACT

Nano-structure includes a substrate and a non-oxidized portion of a metal layer (having an expansion coefficient, during oxidation, that is more than 1) on the substrate. An oxide layer is formed on the non-oxidized portion. A plurality of metal oxide nano-pillars is grown from the oxide layer. Each nano-pillar is grown through a plurality of pores defined in a template. A space is defined between adjacent nano-pillars. A continuous metal oxide cap layer is over the nano-pillars and over, but not in, the space between adjacent nano-pillars. The cap layer is formed from end portions of the nano-pillars that merge together over a template surface. The cap layer is in contact with all of the nano-pillars. The oxide layer, the nano-pillars, and the oxide cap layer are formed from anodization of portions of the metal layer.

17 Claims, 8 Drawing Sheets

(51) Int. Cl.
*C25D 11/02* (2006.01)
*C25D 11/12* (2006.01)
*C25D 11/18* (2006.01)
*C25D 11/26* (2006.01)
*C25D 11/04* (2006.01)
*B82Y 40/00* (2011.01)

(52) U.S. Cl.
CPC ............. *C25D 11/02* (2013.01); *C25D 11/045* (2013.01); *C25D 11/12* (2013.01); *C25D 11/18* (2013.01); *C25D 11/26* (2013.01); *B82Y 40/00* (2013.01); *Y10S 977/89* (2013.01); *Y10T 428/24562* (2015.01)

(56) References Cited

U.S. PATENT DOCUMENTS

| | | | |
|---|---|---|---|
| 6,610,463 B1* | 8/2003 | Ohkura | H01L 21/0275 257/2 |
| 6,914,008 B2 | 7/2005 | Den et al. | |
| 6,972,146 B2* | 12/2005 | Den | C22C 30/00 205/324 |
| 6,982,217 B2 | 1/2006 | Imada et al. | |
| 7,079,250 B2* | 7/2006 | Mukai | G01N 21/554 257/226 |
| 7,192,510 B2 | 3/2007 | Den et al. | |
| 7,208,077 B1* | 4/2007 | Albers et al. | 205/782 |
| 7,265,375 B2 | 9/2007 | Zhang et al. | |
| 7,267,859 B1 | 9/2007 | Rabin et al. | |
| 7,322,871 B2* | 1/2008 | Lambertini | H01K 1/02 313/341 |
| 7,381,658 B2* | 6/2008 | Mardilovich | B81B 1/00 438/758 |
| 7,517,554 B2 | 4/2009 | Saito et al. | |
| 7,569,905 B2 | 8/2009 | Hantschel et al. | |
| 7,572,669 B2 | 8/2009 | Tuominen et al. | |
| 7,594,982 B1 | 9/2009 | Roscheisen et al. | |
| 7,686,885 B2 | 3/2010 | Ku et al. | |
| 7,790,469 B2* | 9/2010 | Wang | G01J 3/44 356/301 |
| 2002/0090649 A1 | 7/2002 | Chan et al. | |
| 2002/0121851 A1* | 9/2002 | Yasui | H01J 9/025 313/310 |
| 2004/0053167 A1 | 3/2004 | Hotta | |
| 2004/0157358 A1 | 8/2004 | Hiramatsu et al. | |
| 2005/0224360 A1* | 10/2005 | Varghese | B82Y 30/00 205/171 |
| 2006/0024193 A1* | 2/2006 | Zhao | C01B 3/0031 420/528 |
| 2006/0088993 A1* | 4/2006 | Zhang | B81C 1/00111 438/618 |
| 2006/0138394 A1* | 6/2006 | Den | B81B 1/002 257/3 |
| 2006/0269797 A1* | 11/2006 | Lu | G11B 5/72 428/834 |
| 2007/0031639 A1 | 2/2007 | Hsu et al. | |
| 2007/0054421 A1* | 3/2007 | Ueda | B82Y 10/00 438/3 |
| 2007/0113530 A1 | 5/2007 | Morozov et al. | |
| 2007/0118939 A1* | 5/2007 | Repetto | C25D 11/12 438/706 |
| 2007/0187238 A1* | 8/2007 | Whalen, III | A61B 5/04001 204/400 |
| 2007/0229817 A1* | 10/2007 | Wang | G01N 21/658 356/301 |
| 2007/0235342 A1 | 10/2007 | Matsuo et al. | |
| 2007/0264749 A1* | 11/2007 | Birkmeyer | B81C 1/00111 438/106 |
| 2008/0037173 A1* | 2/2008 | Saito | B82Y 10/00 360/135 |
| 2008/0047604 A1* | 2/2008 | Korevaar | B82Y 20/00 136/258 |
| 2008/0116168 A1 | 5/2008 | Samper et al. | |
| 2008/0218740 A1* | 9/2008 | Williams | B82Y 20/00 356/72 |
| 2008/0223794 A1* | 9/2008 | Yamamichi | B01J 20/28014 210/767 |
| 2008/0272421 A1* | 11/2008 | Bhat | H01G 4/1254 257/310 |
| 2009/0034122 A1* | 2/2009 | Ichihara | B82Y 10/00 360/131 |
| 2009/0045720 A1 | 2/2009 | Lee et al. | |
| 2009/0243584 A1* | 10/2009 | Zhang | B81C 1/00031 324/71.1 |
| 2009/0266418 A1 | 10/2009 | Hu et al. | |
| 2009/0297913 A1* | 12/2009 | Zhang | H01M 4/92 429/499 |
| 2009/0311516 A1* | 12/2009 | Wei | C25D 11/04 428/335 |
| 2010/0033059 A1* | 2/2010 | Choi | H01L 41/37 310/339 |
| 2010/0047523 A1 | 2/2010 | Kim et al. | |
| 2010/0066346 A1* | 3/2010 | Zhang | B81C 1/00166 324/71.1 |
| 2010/0108132 A1* | 5/2010 | Tsakalakos | B81B 1/00 136/256 |
| 2010/0132772 A1 | 6/2010 | Asano et al. | |
| 2010/0303722 A1* | 12/2010 | Jin | A61L 27/30 424/9.1 |
| 2011/0012103 A1* | 1/2011 | Yang | H01L 21/02554 257/43 |
| 2011/0030382 A1* | 2/2011 | Eadon | B01D 53/22 60/780 |
| 2011/0174069 A1* | 7/2011 | Cornelius | B01J 19/0093 73/204.23 |
| 2011/0284381 A1* | 11/2011 | Cabot | C23C 8/02 205/50 |
| 2011/0311800 A1* | 12/2011 | Yamashita | C25D 11/20 428/304.4 |
| 2013/0161614 A1* | 6/2013 | Tiwari | C25D 5/02 257/43 |

FOREIGN PATENT DOCUMENTS

| | | |
|---|---|---|
| JP | 05210245 | 8/1993 |
| JP | 08296060 | 11/1996 |
| JP | 10147898 | 6/1998 |
| JP | 2000035687 | 2/2000 |
| JP | 2003011099 | 1/2003 |
| JP | 2004098386 | 4/2004 |
| JP | 2004130171 | 4/2004 |
| JP | 2006520697 | 9/2006 |
| JP | 2006326723 A | 12/2006 |
| JP | 2007098563 A * | 4/2007 |
| JP | 2008156705 | 7/2008 |
| JP | 2009037706 | 2/2009 |
| JP | 2009224146 | 10/2009 |
| KR | 100834896 | 4/2004 |
| WO | WO 2009115230 A2 * | 9/2009 |

OTHER PUBLICATIONS

Kiether, William Jay, "Application of Sculptured Thin Film Technology to Metal Oxide Gas Sensors," doctoral dissertation, 2007. Retrieved from http://repository.lib.ncsu.edu/ir/handle/1840.16/3698.*

Furneaux, et al., "The Formation of Controlled-Porosity Membranes From Anodically Oxidized Aluminum", Nature, vol. 337, Jan. 12, 1989, pp. 147-149.

Mardilovich et al., "Electrochemical Fabrication of Nanodimensional Multilayer Films", Nano Letters (2005), vol. 5, No. 10, pp. 1899-1904.

Mardilovich, et al. "Hybrid Micromachining and Surface Microstructuring of Alumina Ceramic", Proc. Electrochem. Society, 2000-19, pp. 33-42.

Masuda et al., "Highly Ordered Nanochannel-Array Architecture in Anodic Alumina", Appl. Phys. Lett. 71 (19), Nov. 10, 1997, pp. 2770-2772.

Mozalev et al., "Nucleation and Growth of the Nanostructured Anodic Oxides on Tantalum and Niobium Under the Porous Alumina Film", Electrochimica Acta 48 (2003), pp. 3155-3170.

(56) References Cited

OTHER PUBLICATIONS

Mozalev et al., "Structure, Morphology, and Dielectric Properties of Nanocomposite Oxide Films Formed by Anodizing of Sputter-Deposited Ta—Al Bilayers", J of Electrochem Society, 151 (11), 2004, pp. F257-F268.

Fang, et al.; "Nanoimprinted SU-8 Nanopillars and Hierarchically Branched Nanowires by Anodic Aluminum Oxide Templates and Their Optical Properties"; Conference Proceeding of Micro/Nano Symposium (UGIM), 2010 ISth Biennial.

Kuo et al.; "Sub-10nm Fabrication of Large Area Periodic Nanopillars", Mat. Res. Soc. Symp. Proc. vol. EXS-2 (2004), pp. M511.1-M511.3.

Kwon et al.; "Simple Fabrication Method of Hierarchical Nano-Pillars Using Aluminum Anodizing Processes"; Current Applied Physics, Mar. 13, 2009, vol. 9, pp. e81-e85.

Lee, et al.; "Fabrication of Polymer Micro/Nano-Hybrid Lens Array by Microstructured Anodic Aluminum Oxide (AAO) Mold"; Microelectronic Engineering; Dec. 9, 2008. vol. 86, pp. 857-860.

Lin, et al.; "Microwatt MOSLED Using SiOx With Buried Si Nanocrystals on Si Nano-Pillar Array"; Journal of Lightwave Technology; Jun. 1, 2008, vol. 26; No. 11; pp. 1486-1491; See figure I.

Mozalev, et al., "The growth and electrical transport properties of self-organized metal-oxide nanostructures formed by anodizing Ta—Al thin-film bilayers"; Journal of Materials Science, 40, 2005, pp. 6399-6407.

Takahashi, et al., "Anodic film growth on Al layers and Ta—Al metal bilayers in citric acid electrolytes", Electrochimica Acta, 2005, p. 5065-5075.

* cited by examiner

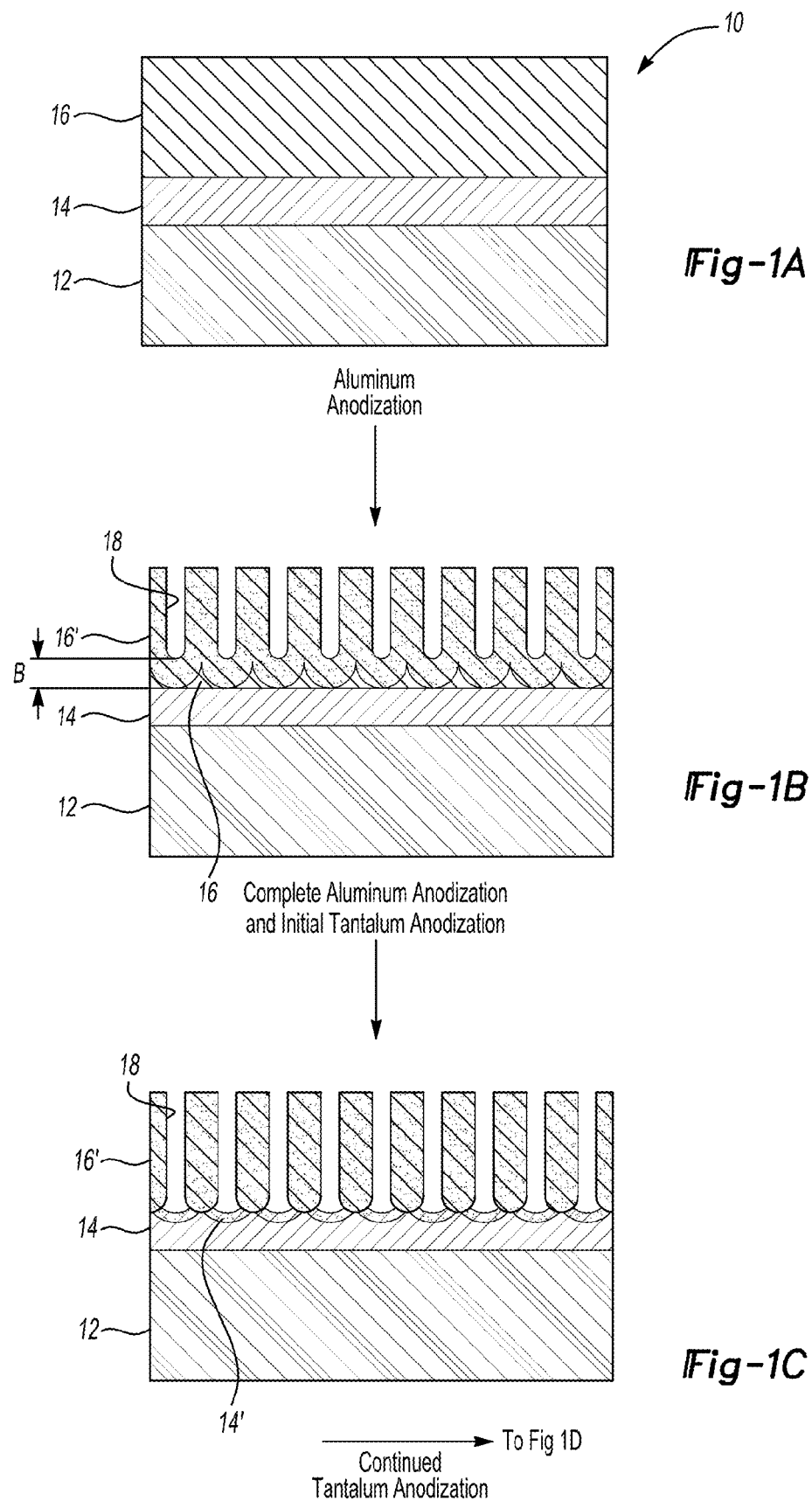

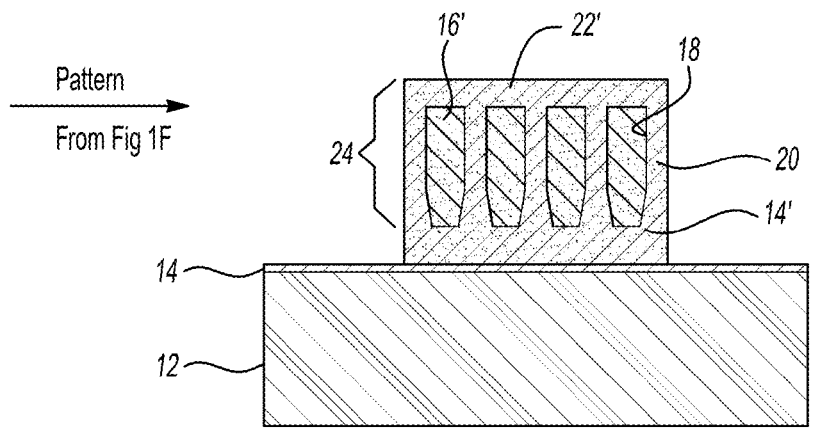
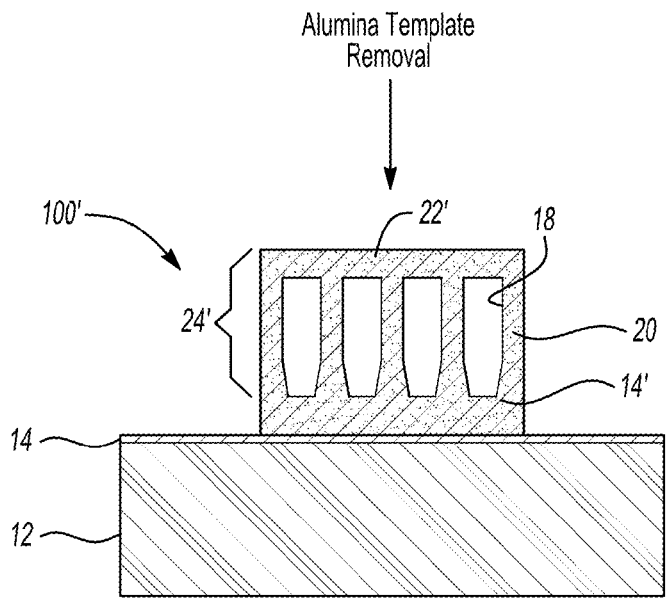
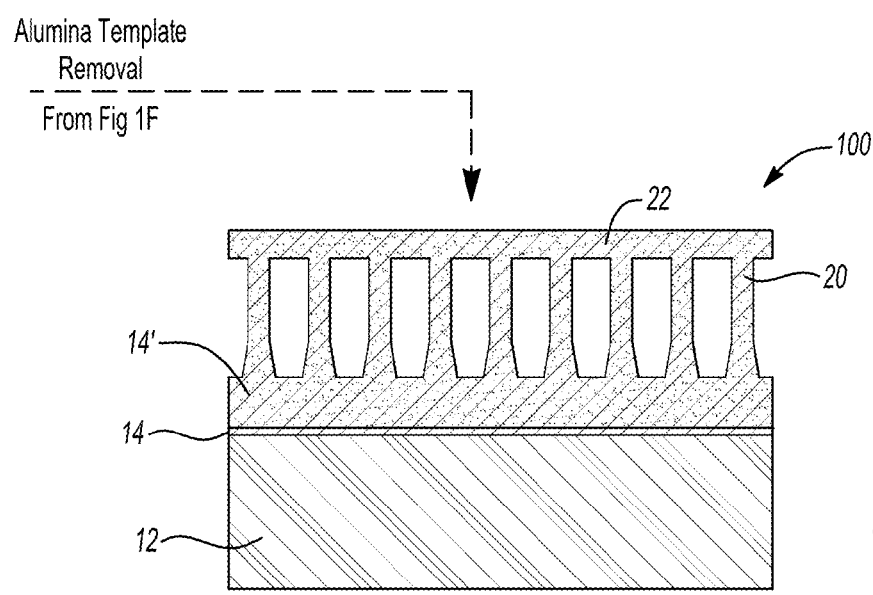

METHOD OF FORMING A NANO-STRUCTURE

BACKGROUND

The present disclosure relates generally to methods of forming a nano-structure.

Porous anodic oxide structures may be used in a variety of applications including, for example, micro- and nano-electronics (such as, e.g., in planarized aluminum interconnections, precision thin-film resistors, thin-film capacitors, and nano-structured field-emission cathodes), electrostatic and thermo-activated switching devices, LC high-frequency oscillators, AC amplifiers, triggers and other logic vacuum integrated circuits (VICs), gas micro- and nano-sensors, micro- and nano-channel plates, mesoscopic engines, wavelength-sensitive filters, reflective and absorbing surfaces, membranes, nozzles, precision apertures, and/or like. These anodic oxide structures may also include one or more arrays of nano-pores that are used, for example, to form nano-structures having one or more arrays of nano-pillars formed on and supported by a substrate. Fabrication processes for forming these nano-structures often dictate, at least in part, the geometry and/or chemistry of the individual nano-pillars, as well as the population density of arrays of the nano-pillars in the structure. In some cases, non-uniformity with regard to the geometry, chemistry and/or population density of the nano-pillars may render the nano-structure as being unsuitable for some applications, such as micro- or nano-fluidic applications.

BRIEF DESCRIPTION OF THE DRAWINGS

Features and advantages of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 1A through 1G together schematically depict an embodiment of a method of forming an embodiment of a nano-structure;

FIGS. 1A through 1F, 1H and 1I together schematically depict another embodiment of the method of forming another embodiment of a nano-structure;

DETAILED DESCRIPTION

Figure 1D:
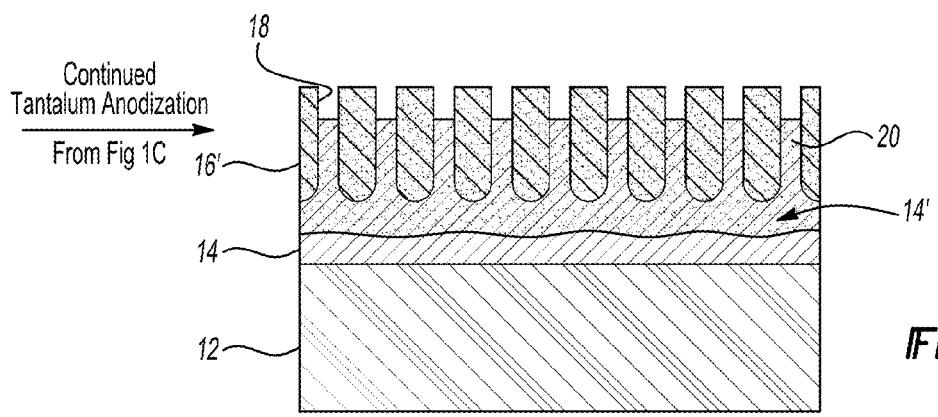

Embodiment(s) of the method disclosed herein may be used to form a nano-structure, which may be used, for example, as a micro- or nano-fluidic device. As used herein, a "microfluidic device" refers to a device for capturing or separating micrometer-sized or smaller particulates within a fluid sample, whereas a "nanofluidic device" refers to a device for capturing or separating nanometer-sized or smaller particulates within a fluid sample. Examples of micro- or nano-fluidic devices include lab-on-a-chip devices, devices for the detection of an analyte, filtration devices, and/or devices for separation of fluidic media.

The nano-structure formed by the embodiment(s) of the method is an anodic oxide nano-structure including a plurality of nano-pillars sandwiched between two non-porous or dense layers. One example of the nano-structure is identified by reference numeral 100 shown in FIG. 1G, and another example of the nano-structure is identified by 100' shown in FIG. 1I. The placement of each nano-pillar may be selectively controlled via the methods disclosed herein so that each nano-pillar is substantially uniformly spaced from an adjacent nano-pillar and/or each array of nano-pillars is substantially uniformly spaced from an adjacent array of nano-pillars. As such, in an embodiment, the size of a gap formed between adjacent nano-pillars or arrays of nano-pillars may be selectively controlled, which reduces defects in the structure 100, 100' when used as a nano-filter. Further, the nano-structures 100, 100' enable nano-filtration of fluidic media in a lateral direction, which is more applicable for a lab-on-a-chip and is more compatible with wafer-scale fabrication.

It is to be understood that the methods disclosed herein may also be used to control other properties of the nano-pillars. In an example, the geometry and/or dimensions of the nano-pillars (such as their height, diameter, shape, etc.) may be controlled by adjusting one or more parameters of the anodizing process employed in the instant methods. The process(es) used for controlling the property/ies of the nano-pillars will be described in further detail below. In one example, the geometry of the nano-pillars may be controlled so that the nano-pillars are substantially uniform in height. This allows the nano-pillars to support one or more structural components (e.g., a wall of a fluid conduit) of the micro- or nano-fluidic device. In another example, the method may be used to control the diameter and/or the pitch of the nano-pillars so that the diameter and/or the pitch of the nano-pillars are uniform across the nano-structure 100, 100'.

One embodiment of the method of forming the nano-structure 100 (depicted in FIG. 1G) is schematically depicted in FIGS. 1A through 1G, while another embodiment of the method of forming the nano-structure 100' (depicted in FIG. 1I) is schematically depicted in FIGS. 1A through 1F, 1H and 1I. The nano-structures 100, 100' formed by the embodiments of the instant method are planar structures that, as mentioned above, may be used as a nano-filter for liquid filtration/separation. The nano-structures 100, 100' may also be used for gas filtration/separation, such as, for example, when portions of the nano-structures 100, 100' are exposed to air, it may be desirable to filter out particles from the air that should not reach a sensor (see, e.g., FIG. 6 discussed further hereinbelow).

It is to be understood, however, that the nano-structures 100, 100' may also be used for other applications, such as for delivery of small and discrete quantities of liquid to a particular location, for example, via a capillary effect (where liquid is sucked into spaces between the pillars when the surface properties (e.g., surface tension, contact angle, etc.) of the pillars are aligned with the properties of the liquid).

Referring now to FIG. 1A, the method of forming the nano-structure 100 includes forming a multi-layered structure 10 that contains i) an oxidizable material layer 14 established on a substrate 12, and ii) another oxidizable material layer 16 established on the oxidizable material layer 14. The multi-layered structure 10 may be formed, for example, by depositing an oxidizable material on the substrate 12 to form the oxidizable material layer 14 having a thickness, and then depositing the other oxidizable material on the oxidizable material layer 14 to form the other oxidizable material layer 16, which also has a thickness. In one embodiment, the oxidizable material layer 14 is formed of a metal or metal alloy that forms a dense oxide after electrochemical oxidation, and the other oxidizable material layer 16 is formed of a metal or metal alloy that forms a porous oxide after electrochemical oxidation. Examples of suitable materials will be discussed further hereinbelow.

The layers 14, 16 have respective thicknesses that may be different or may be substantially the same. In one embodiment, the thickness of each of the layers 14, 16 is in the nanometer range. The layer 14 may have any suitable thickness that will produce (during electrochemical oxidation) enough oxide to form the nano-pillars 20 and the cap layer 22 formed over the nano-pillars 20 (which will be described in further detail below, see FIGS. 1G and 1I). In an example, the thickness of the oxide grown from the layer 14 (i.e., the structure 14', the nano-pillars 20, and the cap layer 22) is determined by multiplying the anodization voltage by an anodization coefficient (i.e., the number of nanometers that the oxide grows per one volt of anodization voltage). For instance, for a Ta layer 14, about 1.8 nm of $Ta_2O_5$ grows per volt of anodization voltage applied to the layer 14 to form a dense $Ta_2O_5$ film. In another instance, from about 1.3 nm to about 1.8 nm of $Ta_2O_5$ grows per volt of anodization voltage applied to the layer 14 to form nano-pillars with an underlying dense $Ta_2O_5$ film and with a dense $Ta_2O_5$ cap layer. In the latter instance (i.e., when the cap layer is formed and there is a dense $Ta_2O_5$ film beneath the nano-pillars), the anodization coefficient depends, at least, on the diameter of the pores in the template 16', the overall porosity of the template 16', the nature of the electrolyte used for Ta anodization, and the current density during Ta anodization.

The thickness of the Ta layer 14 should be thick enough to produce a $Ta_2O_5$ layer having any desired thickness and, in some cases, to maintain some of the Ta layer 14 on the substrate 12 underneath the formed nano-pillars 20 and the dense portion of $Ta_2O_5$. For example, to produce a dense $Ta_2O_5$ layer with no nano-pillars, the total thickness of the Ta layer 14 may be calculated by i) multiplying the anodization voltage by 1.8 nm of $Ta_2O_5$ growth per volt to determine the thickness of $Ta_2O_5$ that grows, and ii) then dividing that number by the expansion coefficient (i.e., the ratio of $Ta_2O_5$ to consumed Ta), which is 2.3. For instance, if an anodization voltage of 200 V is used and 1.8 nm of $Ta_2O_5$ grows per volt (which produces about 360 nm of $Ta_2O_5$), and the expansion coefficient is 2.3, then the thickness of the Ta layer 14 is about 160 nm. In instances where nano-pillars, with an underlying dense $Ta_2O_5$ film, are grown from the Ta layer 14 (with or without a cap layer), the thickness of the Ta layer 14 is based, at least in part, on the volume of $Ta_2O_5$ (which depends, at least in part, on the fraction of pillars in the entire stack, as well as their filling factor, i.e., pillar density) and the anodization coefficient (which depends, at least in part, on the electrolyte used and the anodization conditions, and is from about 1.3 nm to about 1.8 nm for tantalum). The following are two examples of how the Ta layer thickness is calculated when it is desirable to form both nano-pillars and the underlying dense layer. In the first example, the nano-pillars with an underlying dense $Ta_2O_5$ layer are fabricated at 200V. The height of pillars is 240 nm and the dense layer is 50 nm. The anodization coefficient is 1.45 nm/V. The pillar filling factor (or pillars density) is around 25%. In this example, nano-pillars of 240 nm are equivalent to 60 nm of dense $Ta_2O_5$, and thus there is a total of 110 nm of dense $Ta_2O_5$ that will be formed. In order to generate 110 nm of dense $Ta_2O_5$, at least about 50 nm of Ta is used in layer 14 (i.e., 110/2.3≈47.8). In the second example, nano-pillars with an underlying dense $Ta_2O_5$ layer and a dense cap layer are fabricated at 200 V. The height of pillars is about 120 nm, the underlying dense layer is around 185 nm and the cap layer is about 44 nm. The anodization coefficient is around 1.75 nm/V. The pillar filling factor (or pillars density) is around 25%. In this example, nano-pillars of 120 nm are equivalent to 30 nm of dense $Ta_2O_5$, and thus there is a total of 260 nm of dense $Ta_2O_5$ that will be formed. In order to generate 260 nm of dense $Ta_2O_5$, at least about 115 nm of Ta is used in layer 14 (i.e., 260/2.3=113.04). In other examples, these calculations may be performed assuming that the overall density of the nano-pillars is about 90%.

The thickness of the layer 16, on the other hand, should be thick enough to form a template 16' (see FIG. 1B) that is about the same height as the height of the nano-pillars 20 to be grown from the layer 14, but thin enough to allow the cap layer 22 to form over the nano-pillars 20. In one example, the layer 16 has a thickness of 100 nm or less. In another example, the layer 16 has a thickness of 50 nm or less. In an example, the thickness of the template 16' (formed from layer 16) is such that the template 16' is thin enough to allow the nano-pillars 20 to grow through the template 16' and then over the template 16' in order to form the dense cap layer 22. In an example, the thickness of the template 16' is about the thickness of the layer 16 times the expansion coefficient (e.g., about 1.3, which is the ratio between the thickness of the porous anodic alumina and the thickness of the aluminum layer 16 consumed).

In an example, each of the layers 14, 16 are planar (e.g., are substantially flat and include, if any, a minimal amount of irregularities). In another example, one or more of the layers 14, 16 are non-planar. In this example, the non-planar layer(s) 14, 16 may also include a special morphology, features, structures, and/or the like that are etched into or other incorporated into the layers 14, 16. The planar or non-planar layers 14, 16 may be deposited on a planar or non-planar substrate 12, which will be described further below.

The deposition of the oxidizable material on the substrate 12 and the deposition of the other oxidizable material on the oxidizable material layer 14 may be accomplished using any suitable deposition technique known in the art. Some examples of suitable deposition techniques include physical vapor deposition (PVD) (such as, e.g., sputtering, thermal evaporation, and/or pulsed laser deposition), atomic layer deposition (ALD), or, in some instances, chemical vapor deposition (CVD).

The substrate 12 upon which the oxidizable material is deposited to form the layer 14 may be chosen based, at least in part, on the application for which the nano-structure 100 will ultimately be used. If, for example, the nano-structure 100 is to be used for semiconductor applications, the substrate 12 may be chosen from suitable support structures for semiconductors such as, e.g., a substantially planar silicon wafer. By "substantially planar", it is meant that the surface is flat but may contain some irregularities. In this example, the substrate 12 may have formed thereon a layer of insulating material (not shown) such as, e.g., silicon oxide or silicon nitride. The substrate 12 may also or otherwise be a non-planar structure, e.g., the substrate 12 may have a special morphology etched on or fabricated into the substrate 12. The substrate 12 may also be chosen from other materials such as, e.g., glass, quartz, alumina, stainless steel, plastic, and/or the like, and/or combinations thereof. In instances where the nano-structure 100 is used as a nano-filter, the substrate 12 may be chosen from a Si wafer with a thermally grown oxide (TOX) layer thereon, such as TOX/Si or $SiO_2$/Si. In an example, TOX/Si may be formed by oxidizing Si at a high temperature (i.e., from about 800° C. to about 1200° C.) using water vapor (steam) or molecular oxygen as the oxidant. In other words, TOX/Si may be formed via dry or wet oxidation, and the TOX/Si oxide layer may be referred to as a high temperature oxide layer. In some cases, a dry oxygen atmosphere produces a higher quality $SiO_2$, but the process itself is relatively slow. For thicker TOX/Si layers (i.e., a thickness of about 0.5 µm to about 4 µm or more), oxidation of the Si in a wet oxygen atmosphere is desirable. Other examples of suitable substrates include, but are not limited to, SiN, SiC, TEOS (which is $SiO_2$, but is prepared using a chemical vapor deposition (CVD) method from tetra-ethyloxy-silane (i.e., tetra-ethyl-ortho-silicate)), or the like.

The oxidizable material for the oxidizable material layer 14 is a conductor and may be chosen from a material that i) can be electrochemically oxidized and ii) has an expansion coefficient, during oxidation, that is more than 1. In some cases, the oxidizable material for the layer 14 may also or otherwise be thermally oxidized. In one embodiment, the oxidizable material layer 14 includes a material having an expansion coefficient that is more than 1. Without being bound to any theory, it is believed that an expansion coefficient of more than 1 allows the oxidizable material to squeeze into the pores 18 of the template 16' (which will be described in further detail below). It is further believed that the height of the nano-pillars 20 that are formed may, at least partially, be based on the expansion coefficient of the material in the layer 14. In an example, a nano-pillar 20 height ranging from about 10 nm to 1000 nm may be achieved when the expansion coefficient of the oxidizable material in layer 14 is more than 1. It is to be understood that the height of the nano-pillars 20 (including the thickness of structure 14') may also be based, at least in part, on other factors including the anodization voltages used during the respective anodization of layers 16 and 14. Further details about the height of the nano-pillars 20 will be described below. Some examples of suitable oxidizable materials include tantalum (which has an expansion coefficient for thermal oxidation of 2.3, as mentioned above), titanium (which has an expansion coefficient for thermal oxidation of 1.7), niobium (which has an expansion coefficient for thermal oxidation of 2.7), and tungsten (which has an expansion coefficient for thermal oxidation of 3.3). It is to be understood that the expansion coefficient for thermal oxidation for each of the foregoing materials is substantially the same as that for electrochemical oxidation so long as the phase of each of these materials during oxidation is the same.

The other oxidizable material for the other oxidizable material layer 16 is also a conductor, but is chosen from a metal or metal alloy that, after electrochemical oxidation, produces a porous oxide. One example of the other oxidizable material includes aluminum or aluminum alloys, such as an aluminum alloy having aluminum as the main component. It is further to be understood that silicon, titanium, tantalum, niobium, and tungsten in the aluminum alloy may be present in small quantities such as, e.g., up to about 5%. Another example of the other oxidizable material includes titanium, where such material may be oxidized using an appropriate electrolyte and anodization conditions to ultimately produce a porous oxide. In still another embodiment, the material layer 16 may be formed of silicon. When silicon is selected, field assisted anisotropic etching of silicon may take place in the presence of an HF-based electrolyte to create a porous silicon template, which is then oxidized to form a porous silicon dioxide template. It is believed that the layer 14 can still be anodized in the desirable manner when porous silicon dioxide is used as the template 16'. In yet another example, it is believed that the silicon may be transformed into $Si_xN_y$, which is not an oxide but is a dielectric and may be used as a template for $Ta_2O_5$ nano-pillar growth.

The oxidizable material forming the oxidizable material layer 14 and the other oxidizable material forming the other oxidizable material layer 16 are substantially pure. As used herein, the term "substantially pure" refers to a material (such as a metal or a metal alloy) having a minimal amount, if any, impurities present therein. In an example, a substantially pure metal may be one that includes at least 95% of the metal. In some cases the substantially pure metal includes about 100% metal, and thus practically no impurities. In these cases, the metal may be referred to as a substantially pure metal, a pure metal, or just a metal. In an example, the substantially pure metal has at least about a 99.9% (e.g., often expressed as 3N), and in some cases at least about 99.99% purity (e.g., often expressed as 4N). It is to be understood that, in some instances, the oxidizable material and/or the other oxidizable material may be a metal alloy.

For purposes of illustration, the method depicted in the FIG. 1 series will be described using tantalum as the oxidizable material in the oxidizable material layer 14, and aluminum as the oxidizable material in the other oxidizable material layer 16. As such, in reference to FIGS. 1A through 1I, the layer 14 will be referred to as the tantalum layer 14, and layer 16 will be referred to as the aluminum layer 16. However, as previously noted, the layers 14 and 16 are not to be construed as being limited to being formed of tantalum and aluminum, respectively, but can be any of the oxidizable materials listed herein for the respective layers 14, 16.

After the multi-layered structure 10 is formed, a template 16' is formed out of the aluminum layer 16, as shown in FIG. 1B. In one embodiment, the template 16' is formed by anodizing the aluminum layer 16. Anodization refers to the oxidation of less than the entire thickness of the layer being anodized. It is to be understood that enough of the aluminum layer 16 is anodized to form the desired template 16', which includes a plurality of pores 18 defined therein and a barrier layer B of alumina that defines the bottom of each pore 18. As illustrated in FIG. 1B, after template 16' formation, there is some remaining non-anodized aluminum 16 (e.g., the pyramids of aluminum 16).

Referring back to FIG. 1B, anodization of the aluminum layer 16 to form the template 16' may be accomplished by employing the aluminum layer 16 as the anode of an electrolytic cell and selecting one or more of $H_2SO_4$ (sulfuric acid), $H_3PO_4$ (phosphoric acid), $C_2H_2O_4$ (oxalic acid), or $H_2CrO_4$ (chromic acid) as the electrolyte. These electrolytes form porous alumina rather than dense alumina. The electrolyte may be present in a water based solution. In one embodiment where the electrolyte is oxalic acid ($C_2H_2O_4$), the electrolyte may be present, in solution with water, at a wt % ranging from about 1 wt % to about 5 wt %. In another embodiment where the electrolyte is $H_2SO_4$, the electrolyte may be present, in solution with water, at a vol % ranging from about 5 vol % to about 40 vol %. In some instances, certain additives (e.g., an alcohol, a surfactant, etc.) may also be added to the electrolyte solution. It is to be understood that the concentration of electrolyte in solution and the other conditions may vary as long as they are suitable for porous anodization (i.e., the formation of the porous template 16'). Any suitable cathode may be used, for example, aluminum or platinum (e.g., foil or mesh). A suitable amount of voltage and current is then applied to the electrolytic cell for an amount of time to anodize the aluminum layer 16 (i.e., where the anodized portion of the aluminum layer 16 is oxidized). The anodization of the aluminum layer 16 forms porous anodic aluminum oxide (i.e., porous anodic alumina), and allows the alumina to grow to a desired thickness.

The porous template 16' is shown in FIG. 1B. It is to be understood that the pores 18 at this point in the process do not extend through to and expose the underlying tantalum layer 14. The size of the pores 18 formed during anodization may be controlled through the selection of the electrolyte and the anodization conditions. For instance, for an alumina template, the diameter D of a cell 17 is about 2.8 nm per volt (e.g., when Al is used for layer 16), and the diameter d of the pore 18 depends on the electrolyte and the current density. In one embodiment, the diameter d of the pore 18 is proportional to the voltage used. The ratio of the cell diameter and the pore diameter (D/d) is, for example, 3.3 for a $H_2CrO_4$ electrolyte, 4.9 for a $H_2SO_4$ electrolyte, 3.0 for a $H_2C_2O_4$ electrolyte, and between 1.7 and 2.1 for a $H_3PO_4$ electrolyte. As examples, pores of the following sizes may be obtained using the following electrolytes: pores having about 20 nm diameters may be obtained using $H_2SO_4$ as the electrolyte, pores having about 40 nm diameters may be obtained using $C_2H_2O_4$ as the electrolyte, and pores having about 120 nm may be obtained using $H_3PO_4$ as the electrolyte. The size of the pores 18 may also be controlled via anisotropic etching after anodization is complete. This etching process further defines the already formed pores 18, and in many instances increases the diameter of the formed pores 18. Anisotropic etching may be performed using diluted phosphoric acid (5 vol. %), a solution of $H_2SO_4$ (20 vol. %), or a diluted form of a hydroxide such as, e.g., NaOH or KOH. The time for etching may vary, depending, at least in part, upon the desirable average diameter for the final pores 18. In an embodiment, the anisotropic etching time ranges from about 1 minute to about 45 minutes in instances where anisotropic etching is performed using a diluted phosphoric acid (5 vol. %). The temperature for etching may also depend upon the process and etchant used. In one embodiment, the etchant temperature ranges from about 0° C. to about 100° C. depending, at least in part, on the type of etchant used. In an example, the etchant temperature ranges from about 20° C. to about 40° C., for example, when a diluted phosphoric acid etchant is used.

In another embodiment, prior to performing anodization, the method includes patterning the aluminum layer 16. Patterning may be accomplished via any suitable technique, and is used to perform localized anodization of the aluminum layer 16. One example of patterning is standard photolithography, which includes depositing a hard mask material (e.g., $Si_xN_y$, such as SiN or $Si_3N_4$) on the aluminum layer 16, and then using a photoresist to pattern the $Si_xN_y$ material to allow localized exposure of aluminum. In an example, the mask is patterned to expose portion(s) of the aluminum to the electrolyte. In some cases, the aluminum may also be patterned and etched to produce clusters of aluminum (i.e., formed when areas of aluminum are etched, but the Ta is still present). In other cases, aluminum and tantalum are patterned and etched to produce clusters of aluminum/tantalum. In this example, the interface formed between the mask and the aluminum layer 16 is robust, which advantageously prevents separation of the layers during anodization. In one embodiment, the areas that remain exposed once the mask and photoresist are in position are subject to local anodization. The aluminum layer exposed via the patterned mask or the patterned aluminum layer (not shown) is then locally anodized, for example, by employing the exposed or patterned aluminum layer as the anode of an electrolytic cell, and employing any suitable cathode, such as aluminum (having a 99.99% purity) and/or platinum (foil or mesh). The electrolyte may be selected from any electrolyte that will suitably allow the formation of porous alumina. Some examples of the electrolyte include solutions of $H_2SO_4$, $H_3PO_4$, $H_2C_2O_4$, and $H_2CrO_4$. A suitable voltage and current is then applied to the electrolytic cell for an amount of time to anodize the patterned aluminum layer.

The combination of patterning and anodization forms a porous anodic alumina template 16' in specific locations and with specific dimensions. The template 16' formed via this embodiment of the method may also be anisotropically etched as previously described to further define the pores 18.

In one example, the anodization of the aluminum layer 16 may be accomplished via a potentiostatic regime, whereby a constant anodization voltage is applied. Due at least in part to the pore diameter being proportional to voltage, anodization using a constant voltage produces pores having a substantially constant diameter from top to bottom. In another example, the anodization may be accomplished via a galvanostatic regime, whereby a constant current density is applied, and thus a constant rate of anodization is achieved. In this example, the voltage may vary during the anodization, which produces pores having a varying diameter from top to bottom.

The anodic alumina template 16' is schematically shown in FIG. 1B (cross-sectional view). Another example of the anodic alumina template 16' (where a portion of the aluminum layer 16 remains) is shown in FIGS. 2A (perspective view), 2B (top view), and 2C (an SEM image of a cross section of the template 16') where the template 16' includes a plurality of cells 17 (see FIGS. 2A and 2B) each having a pore 18 defined therein. It is to be understood that the SEM image shown in FIG. 2C was anisotropically etched for 30 minutes to increase the diameter of the pores 18. In an example, each of the pores 18 defined in the template 16' is oriented substantially normal to the substrate 12 surface.

Figure 1E:
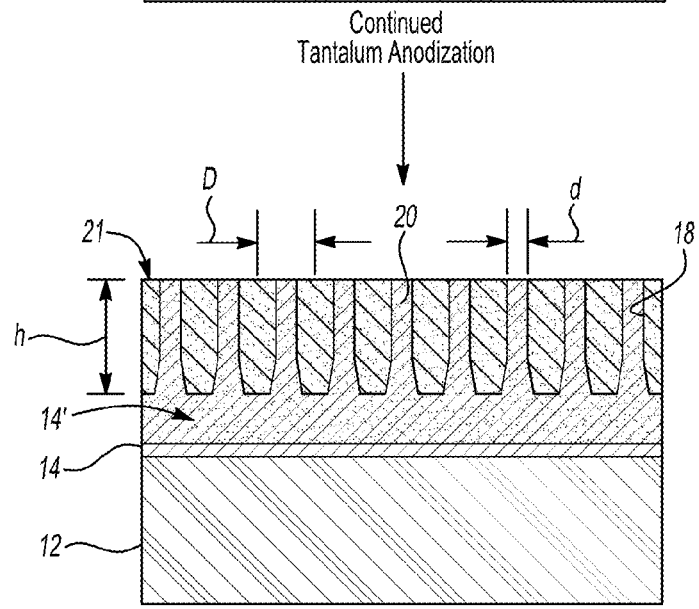
Figure 2A:
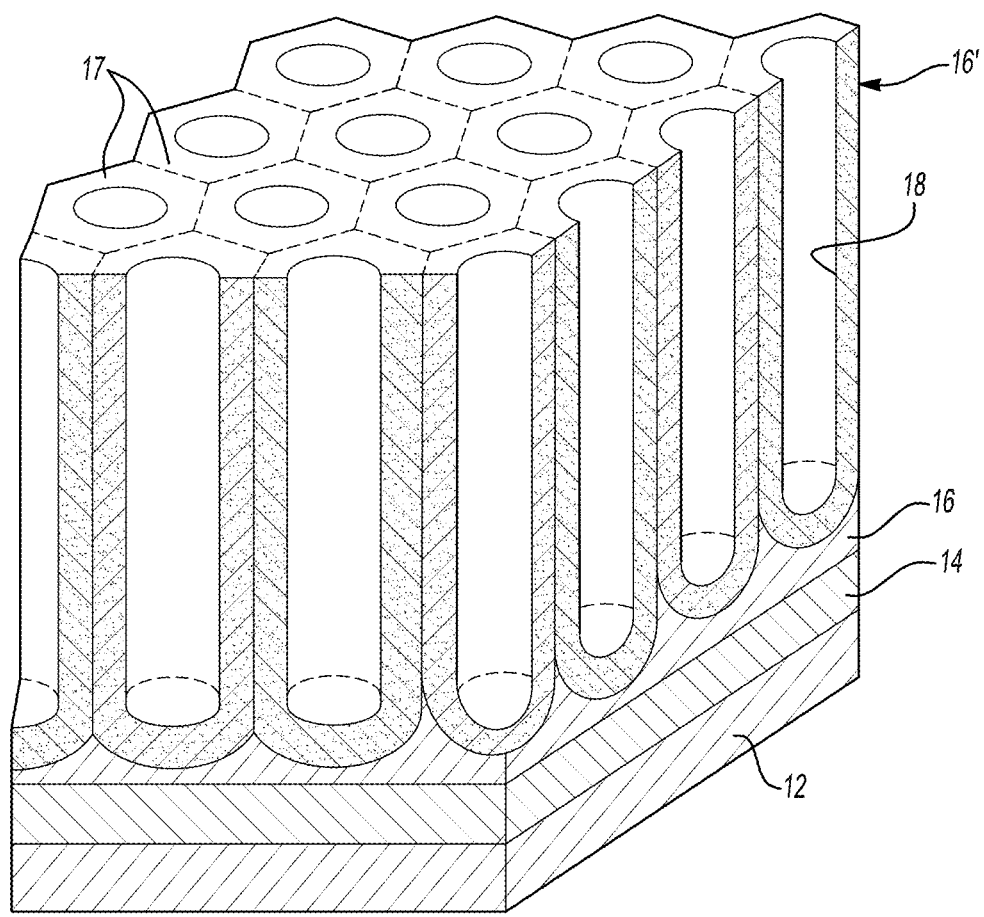
FIG. 2A is a schematic three-dimensional representation of the porous anodic alumina template prior to complete anodization of the aluminum.

Referring now to FIG. 1C, either anodization is continued or another anodization current and voltage is applied to initiate a plurality of steps that lead to the complete anodization of the remaining aluminum layer 16 and the formation of tantalum pentoxide nano-pillars 20 (see FIG. 1D). The anodization process that oxidizes remaining aluminum 16 and oxidizes the tantalum 14 may be accomplished, for example, using the same process described above for initial anodization of the aluminum layer 16 (to form the template 16'). In one embodiment, the anodization of remaining portions of the aluminum layer 16 and the layer 14 is accomplished by employing the tantalum layer 14 as the anode of an electrolytic cell and employing platinum, stainless steel, or any other appropriate material as the cathode, and applying a suitable anodization voltage and/or current density to initiate the various processes described herein.

It is to be understood that the remaining aluminum layer 16 (e.g., aluminum fragments located between alumina cells 17 of the template 16') may become anodized via a variety of methods. When the remaining aluminum layer 16 is anodized, it become alumina and essentially becomes part of the barrier layer B. This alumina barrier layer B is a dielectric layer between the electrolyte and the metal (in this case, tantalum).

It is to be understood that the remaining aluminum layer 16 can be anodized using the same electrolyte used to form the template 16', or can be anodized using another electrolyte that results in the formation of dense (as opposed to porous) alumina. When the electrolyte used to form the template 16' is used to oxidize the remaining aluminum layer 16, the anodization process used for the aluminum layer 16 may simply be continued until complete aluminum anodization is achieved and the tantalum interface is reached (as indicated, for e.g., by the change in current density). In the embodiment where the electrolyte used to complete aluminum anodization is the same electrolyte that forms the porous template 16', it is believed that the barrier layer B making up the bottom of the pores 18 is etched away by field assisted dissolving. This dissolution opens up the pores 18 to enable growth of tantalum pentoxide nano-pillars 20 therein. In this embodiment, tantalum anodization may be performed using the same electrolyte (i.e., the electrolyte that forms the porous template) or another electrolyte.

When the same electrolyte is used for template 16' formation and tantalum layer 14 anodization, the anodization process is continued in order to begin the oxidation of the tantalum layer 14. As shown in FIGS. 1B and 1C, in this embodiment, complete aluminum anodization (i.e., formation of the template 16', oxidation of the remaining aluminum 16, and dissolution of the bottom of each pore 18) and tantalum anodization may take place in the same electrolyte (e.g., oxalic acid). This electrolyte will form the template 16', anodize remaining aluminum 16, will dissolve alumina from the bottom of the pores 18, and will subsequently grow a dense oxide from the layer 14. This advantageously enables the barrier layer B at the bottom of each pore 18 to dissolve and the $Ta_2O_5$ to be generated at the same time, thus keeping the overall thickness of the oxide such that it corresponds to the applied voltage.

In another embodiment, complete aluminum anodization is performed in the electrolyte that results in the porous alumina template 16' with open pores 18 (e.g., oxalic acid), and then the electrolyte may be switched to form the dense tantalum pentoxide. In this embodiment, the electrolyte used during the subsequent anodization is selected from citric acid ($C_6H_8O_7$), boric acid ($H_3BO_3$), ammonium pentaborate (($NH_4$)$_2B_{10}O_{16}$×$8H_2O$), ammonium tartrate ($H_4NO_2CCH(OH)CH(OH)CO_2NH_4$), or another suitable electrolyte. This electrolyte will form the dense tantalum pentoxide layer 14' that will ultimately grow to form the nano-pillars 20.

In still another embodiment (not shown in figures), after the template 16' is formed and some aluminum layer 16 remains, another electrolyte (i.e., an electrolyte that results in the formation of a dense, rather than porous, alumina) is used to oxidize the remaining aluminum layer 16 and to grow the $Ta_2O_5$. In this embodiment, the electrolyte solution will be switched, and anodization of the remaining aluminum layer 16 and of the tantalum layer 14 will take place in this other electrolyte (examples of which include citric acid ($C_6H_8O_7$), boric acid ($H_3BO_3$), ammonium pentaborate (($NH_4$)$_2B_{10}O_{16}$×$8H_2O$), ammonium tartrate ($H_4NO_2CCH(OH)CH(OH)CO_2NH_4$), and/or another suitable electrolyte). In this embodiment, the anodization of the remaining aluminum layer 16 will form a dense alumina that increases the thickness of the barrier layer B, but will not open up the pores 18. Without being bound to any theory, it is believed that when the electrolyte selected to anodize the remaining aluminum layer 16 forms dense alumina (e.g., electrolyte is citric acid), the growth of the tantalum pentoxide nano-pillars will push the remaining barrier layer B up through the pores 18, which may be the source of alumina traces in the resulting nano-pillars 20.

Whichever process and electrolyte is selected for tantalum layer 14 anodization, it is to be understood that as the anodization of the oxidizable material layer 14 (in this example the tantalum layer 14) continues, the oxidized form of the tantalum (i.e., tantalum pentoxide structure 14') grows through the individual pores 18 defined in the template 16' to form a nano-pillar 20 of tantalum pentoxide in each pore 18, as shown in FIG. 1D. This structure 14' is grown from the tantalum layer 14, and some of the structure 14' grows through the pores 18 of the template 16'. The growing of the structure 14' may be accomplished, for example, by partially anodizing the tantalum layer 14 (i.e., part of the layer 14 is oxidized, and part of the layer 14 remains non-oxidized) as previously described.

The oxidized form of the tantalum formed during the anodization of the tantalum layer 14 is a substantially pure oxide. As used herein, a "substantially pure oxide" refers to an oxide that may include some impurities. Typically, dense oxides (such as the structure 14') have a smaller amount of impurities as compared to porous oxides (such as the template 16'). In one embodiment, the dense oxide includes a small portion of the alumina (or other material forming the template 16') and/or of the electrolyte. In one embodiment, the porous alumina template 16' may have up to about 15 wt % or up to about 18 wt % of electrolyte ions incorporated and/or absorbed/adsorbed therein.

It is to be understood that the volume of the tantalum pentoxide that grows during the anodization of the tantalum layer 14 should exceed the volume of the tantalum from which the oxide is formed so that the oxide squeezes into the pores 18 of the template 16' to form the nano-pillars 20. The orientation of the nano-pillars 20 is generally controlled by the orientation of the pores 18. In the example of the method depicted in the FIG. 1 series, the nano-pillars 20 are oriented in a position that is substantially normal to the substrate 12.

Figure 2B:
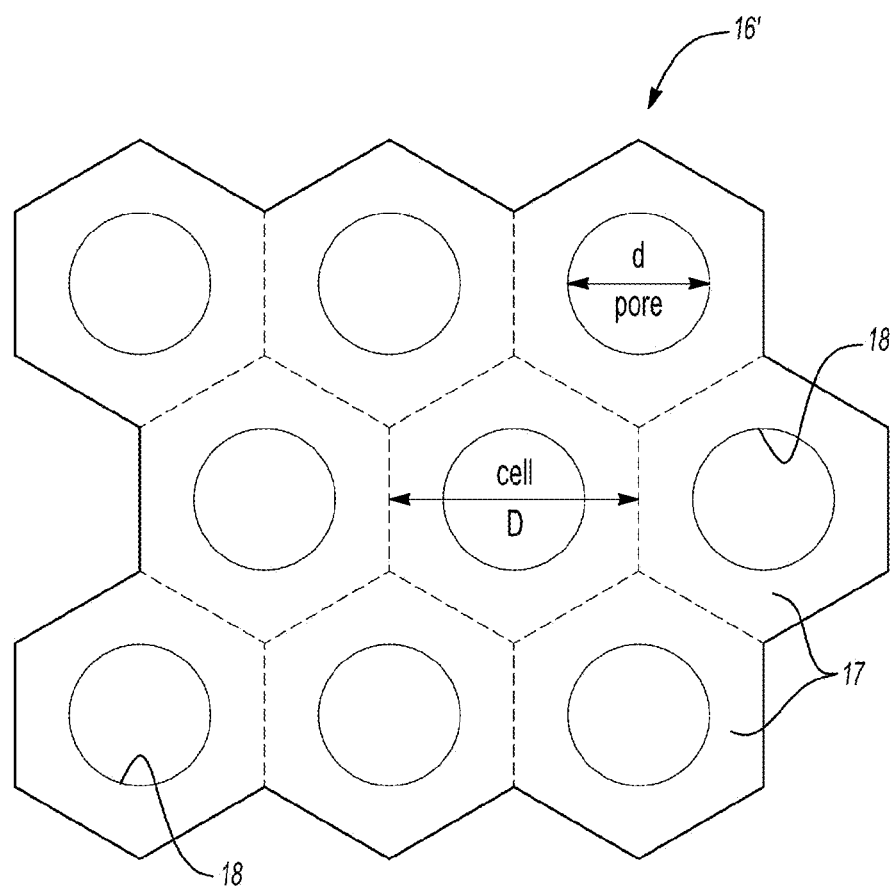
FIG. 2B is a top view of the anodic alumina template of FIG. 2A.
Figure 2C:
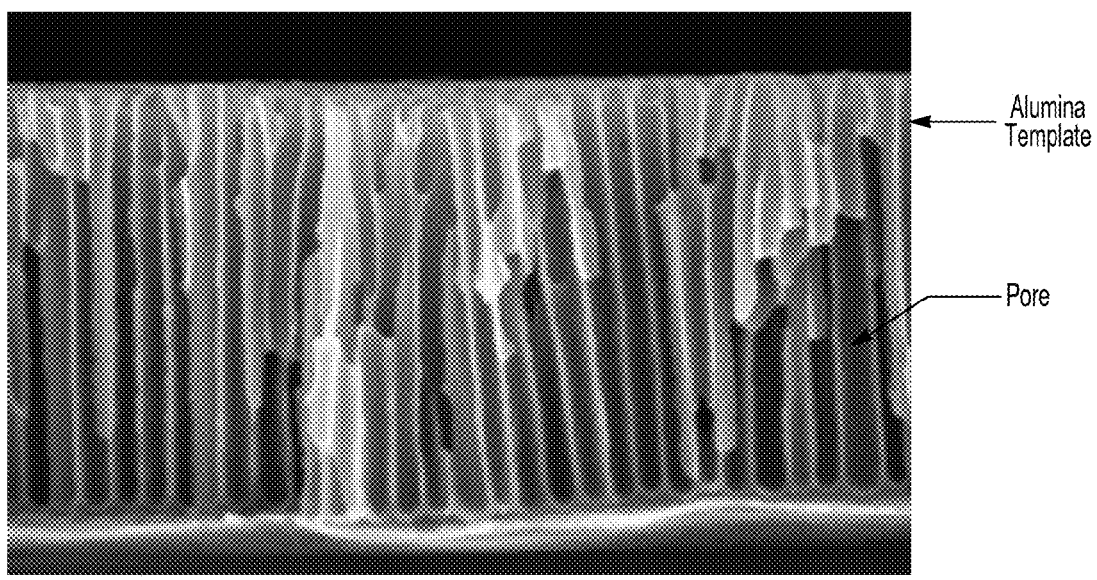
FIG. 2C is a scanning electron micrograph (SEM) image showing a cross-section of an anodic alumina template after about 30 minutes of etching.

It is further to be understood that the configuration/structure of the pores 18 may also dictate the geometry and/or dimensions of the individual nano-pillars 20. For instance, the template 16' may be formed so that the pores 18 have a uniform diameter, a uniform pitch, and a uniform height. When the nano-pillars 20 grow during the anodization, the geometry and/or dimensions of the nano-pillars 20 will conform to that of the pores 18 within which the nano-pillars 20 are growing. The geometry and/or dimensions of the nano-pillars 20 may further be controlled by adjusting one or more parameters of the oxidizing material anodization process. For instance, as illustrated in FIGS. 1D and 2B, the pitch D of the nano-pillars 20 (which is equivalent to the cell 17 diameter of the anodic alumina template 16') will depend on the anodization voltage of the anodization process used to form the template 16'. The diameter d of the nano-pillars 20 (which is equivalent to the pore 18 diameter) will depend on the nature of the electrolyte selected and the current density used during the anodization of the aluminum layer 16 to form the template 16'. The diameter d may also depend upon the degree of anisotropic etching used to further refine and define the pores 18. As mentioned above, the height h of the nano-pillars 20 and the dense underlying $Ta_2O_5$ layer 14' is proportional to the anodization voltage applied to the tantalum layer 14 during its anodization. Other factors that affect the height of the nano-pillars 20 and the dense underlying $Ta_2O_5$ layer 14' include the duration of anodization at the anodization voltage, pore diameter, and possibly one or more other factors. As mentioned above, for growing a dense tantalum pentoxide film, about 1.8 nm of the oxide grows per one volt, and for growing nano-pillars with a dense underlying tantalum pentoxide layer and/or a cap layer, from about 1.3 nm to about 1.8 nm of the oxide grows per one volt. Other dimensions that may be derived from the pitch D, the diameter d, and the height h include the gap G between the nano-pillars 20 (i.e., D-d=gap) and the aspect ratio (i.e., h/d=aspect ratio) of the nano-pillars 20. In an example, the nano-pillars 20 have i) a pitch D ranging from about 30 nm to about 500 nm, ii) a diameter d ranging from about 10 nm to about 350 nm, and iii) a height h ranging from greater than 10 nm to about 500 nm. In another example, the gap G between adjacent nano-pillars 20 ranges from about 0 nm (i.e., where the nano-pillars 20 physically touch each other) to about 300 nm.

It is to be understood that the anodization of the tantalum layer 14 forms a dense anodic oxide, and as anodization continues, both the interface between the oxidizable material layer 14 and the formed anodic oxide (i.e., oxide structure) 14' and the interface between the anodic oxide 14' and the electrolyte (not shown) are planarized. The affect of planarization at the interfaces is shown in FIG. 1E.

Figure 1F:
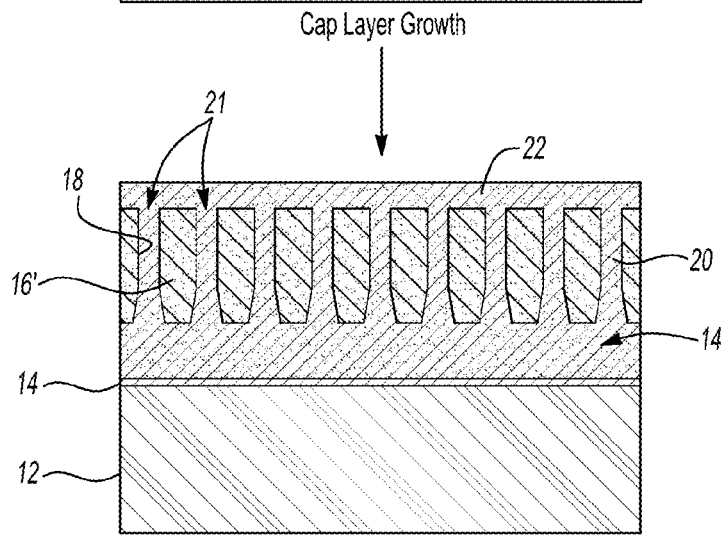

Referring now to FIG. 1F, the tantalum layer 14 is anodized at an appropriate anodization voltage and/or current density for an amount of time sufficient for the tantalum pentoxide nano-pillars 20 to grow through the entire thickness or height of their respective pores 18. When the tantalum pentoxide nano-pillars 20 reach the top of the template 16' (i.e., the top of the pores 18), the tantalum pentoxide continues to grow over the template 16'. More specifically, upon reaching the top of the pores 18, the tantalum pentoxide of one nano-pillar 20 spreads over the top of the individual cells 17 of the template 16' and merges with the tantalum pentoxide of an adjacent nano-pillar 20. The spreading of the tantalum pentoxide from the nano-pillars 20 occurs in all directions so that a dense layer 22 can be formed over the pillars 20 and over the template 16'. In other words, the respective ends 21 of the nano-pillars 20 continue to grow, and ultimately spread across the surface of the template 16' and merge together to form a substantially continuous cap layer 22 (i.e., a cap layer 22 that is absent of, or includes a very small number of holes, gaps, or the like).

The cap layer 22 has a thickness that is controllable by the anodization of the tantalum layer 14. In one example, the thickness increases as the anodization voltage increases. In many cases, the total mass of the nano-structure 100 may be controlled by adjusting the thickness of the cap layer 22 or a lateral area of the cap layer 22. In an example, the cap layer 22 should be thick enough so that the cap layer 22 is dense. In an example, the thickness of layer 22, the height of each of the nano-pillars 20, and the thickness of the dense oxide layer 14' formed beneath the nano-pillars 20 is proportional to the anodization voltage. As mentioned above, for anodization of the tantalum layer 14, the overall thickness of the nano-structure 100 is about 1.3 nm to about 1.8 nm per 1 volt of anodization, which depends, at least in part, on those factors previously mentioned, including the duration of anodization, the diameter of the pores 18, and the type of nano-structure to be formed. Accordingly, in one example, for a tantalum anodization voltage of about 200 V, the overall thickness of the tantalum pentoxide structures (e.g., cap layer 22, nano-pillars 20, and layer 14' beneath the pillars 20) is about 350 nm (such as shown, e.g., in FIGS. 1F and 5). As such, the cap layer 22 is dense when the cap layer 22 is about as thick as the diameter of the nano-pillars 20 (or the diameter of the pores 18 of the anodic alumina template 16'). In an example, the thickness of the cap layer 22 is about 45 nm where aluminum anodization is performed using an oxalic acid electrolyte at 2 wt % at an anodization voltage of 30 V and the pore diameter is about 30 nm. In another example, the maximum thickness of the cap layer 22 depends, at least in part, on how thick the entire nano-structure 100 can be made, minus the height of nano-pillars 20 and minus the thickness of dense tantalum pentoxide layer 14' upon which the nano-pillars 20 are formed.

As used herein, the term "dense" with reference to the cap layer 22 refers to a non-porous layer that may, in some instances, have some defects (e.g., pinholes, etc.). In some cases, these defects may be covered by depositing an additional layer over the cap layer 22 (not shown in the figures). It is to be understood that the small size of the defects (i.e., which is significantly smaller than the distance between nano-pillars 20) prevents penetration of undesirable quantities of the additional layer into the area where the nano-pillars 20 are present. In other cases, the defects may be desirable, and thus are not covered up with an additional layer. For example, such defects may enable easier removal of the alumina template 16' (which will be described hereinbelow), especially when the dimensions of the cap layer 22 are relatively large, e.g., the layer 22 dimensions exceed 100×100 microns.

In the instant embodiment of the method, the template 16' is selectively removed to expose the nano-pillars 20 and form the nano-structure 100, as shown in FIG. 1G. In an example, the template 16' is removed using a selective etching process that will remove the anodic alumina template 16' without deleteriously affecting the other features (e.g., 14', 20, 22). Selective etching may be accomplished using an etchant solution (such as, e.g., $H_3PO_4$—$CrO_3$—$H_2O$) solution) at a temperature ranging from about 80° C. to about 95° C. It is to be understood that etching may also be accomplished at a temperature outside of the foregoing range, but the duration of the etching may be affected. For instance, at a temperature lower than 80° C., the duration of the etching may be longer. In some cases, etching may also be accomplished at temperatures as high as the boiling point of the solution (such as, e.g., about 100° C.). In this embodiment, $H_3PO_4$ etches the alumina and the $CrO_3$ passivates aluminum etching (this is particularly desirable when working with patterned aluminum and localized alumina). In one example, the etchant solution includes about 92 g of $H_3PO_4$, about 32 g of $CrO_3$, and about 200 g of $H_2O$, although it is to be understood that the components of the etchant may vary. It has been found that the nano-pillars 20 can withstand this particular etching process for more than one hour, while the anodic alumina template 16' is etched away at a rate of about 1 micron per minute. Other etching solutions that may be used include hydroxide solutions such as, e.g., NaOH, KOH, etc. The alumina template 16' may also be etched using a 5% $H_3PO_4$ solution at 30° C., $H_2SO_4$, etc. Etching may be accomplished, e.g., in a lateral direction to a distance of about 100 μm, and in some instances even further.

As stated above, another embodiment of the method for forming another embodiment of the nano-structure 100' is schematically depicted in FIGS. 1A through 1F, 1H and 1I. In this embodiment, after the cap layer 22 is formed in the process step shown in FIG. 1F, the method further includes patterning some of the nano-pillars 20, some of the cap layer 22, some of the template 16', some of layer 14', and in some cases, some of the non-anodized tantalum layer 14 to form a pre-nano-island 24, as shown in FIG. 1H. The pre-nano-island 24 is a precursor to a nano-island 24', which as used herein, is a set of nano-pillars 20 including the cap layer 22' thereon (see FIG. 1I). The set of nano-pillars 20 includes those nano-pillars 20 that remain after one or more are removed. The cap layer 22' is the portion of the original cap layer 22 that remains after portion(s) thereof is/are removed. As illustrated in FIG. 1H, the cap layer 22' covers the set of nano-pillars 20 alone. Any suitable patterning and removal process may be used to remove the desired portions of the nano-pillars 20, cap layer 22, and template 16'. In one example, photolithography (using a photoresist or hard mask) is used to remove the desired portions of these components 20, 22, 16', 14' leaving the pre-nano-island 24. It is to be understood that the portions of the remaining layer 14 may also be removed. In another example, a SiN (e.g., $Si_xN_y$ or $Si_3N_4$) hard mask may be used for patterning, and then the desired portions of components 20, 22, 16' may be etched away.

Once desired pre-nano-island(s) 24 are formed, the method further includes selectively removing any remaining portion of the template 16'. This may be accomplished using the process(es) previously described in reference to FIG. 1G. The removal of the remaining template 16' forms the nano-island 24' and the nano-structure 100', as shown in FIG. 1I.

Figure 3:
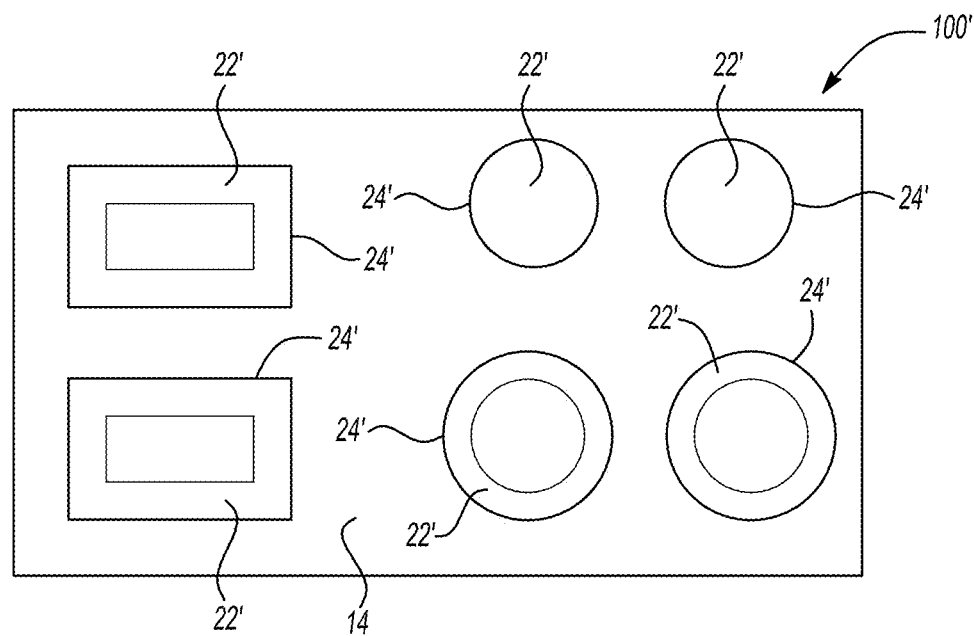
FIG. 3 is a top view schematically depicting an example of a nano-structure formed according to the embodiment of the method described in conjunction with FIGS. 1A through 1F, 1H and 1I.

It is to be understood that although a single nano-island 24' is shown in FIG. 1I, the process described above may be used to form a plurality of nano-islands 24'. For instance, the patterning/removal process may be used to remove particular groupings of nano-pillars 20, any cap layer 22 established thereon, and any template 16' and layer 14' located therebetween to form isolated pre-nano-islands 24. When the remaining template 16' is removed from these pre-nano-islands 24, multiple isolated nano-islands 24' will be formed on the substrate 12. A top view of the nano-structure 100' including a plurality of nano-islands 24' is schematically shown in FIG. 3. As shown in FIG. 3, the cap layer 22 and/or the nano-islands 24' may be circular shaped, rectangular shaped, donut shaped, frame shaped, and/or have any other desirable geometric shape.

It is to be understood that, in some cases, it may be desirable to modify the surface chemistry of the nano-pillars 20 and/or of the cap layer 22, for example, to improve the chemical robustness of the nano-structure 100, 100', to tune the contact angle of these surfaces in order to improve wettability or to stop wetting, to change the acidity or zeta potential of these surfaces so that the surfaces may have a different affinity to different chemicals, etc. Modification of the surface chemistry may be accomplished, for example, by depositing a material on a surface of the nano-pillars 20 and/or the cap layer 22. Deposition of the material may be accomplished, for example, by atomic layer deposition, chemical vapor deposition, metal organic chemical vapor deposition (MOCVD), electrochemical deposition, and/or the like. In an example, the material may be conformally deposited over the entire surface of the selected nano-pillars 20 and/or the cap layer 22 at a thickness ranging from about 4 nm to about 8 nm. In another example, the thickness of the deposited layer is about 6 nm. Some examples of the materials that may be deposited on the nano-pillars 20 and/or the cap layer 22 include aluminum oxide, zirconium oxide, titanium oxide, silicon dioxide, tungsten oxide, zinc oxide, hafnium oxide, or combinations thereof.

Figure 4:
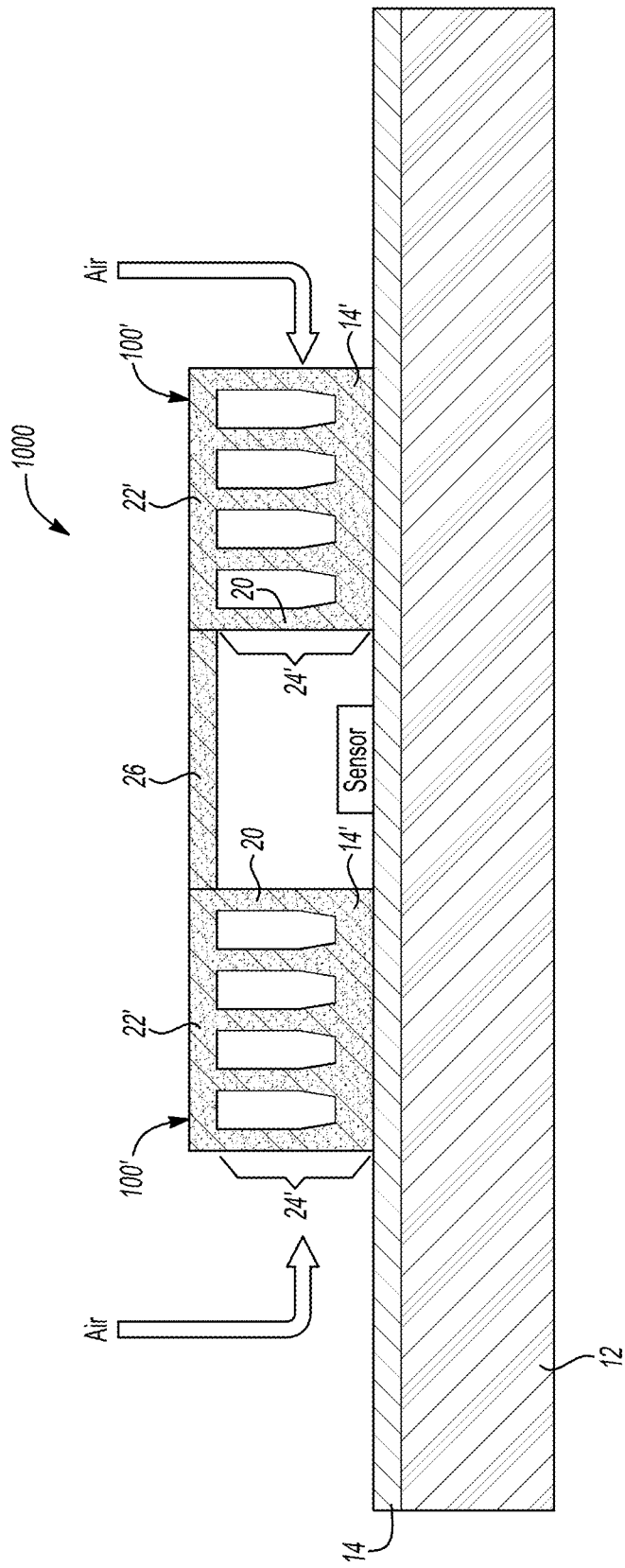
FIG. 4 is a schematic diagram of the nano-structure of FIG. 1I used as a nano-filter for gas filtration/separation.

As mentioned above, the nano-structure 100, 100' may be used as a nano-filter for liquid or gas filtration/separation. One embodiment of such a filter 1000 is shown in FIG. 4. FIG. 4 illustrates two nano-clusters 24' with a gap between the clusters 24'. These nano-clusters 24' may be formed a spaced distance from one another using embodiments previously described. In one embodiment, after the formation of the nano-clusters 24', a sensor may be placed in the gap. In another embodiment, the sensor may be placed in a suitable position and the multi-layered structure could be formed around the sensor. In still another embodiment, the sensor could be a sensing surface of the underlying substrate. When it is desirable to form a cap over the gap after the nano-clusters 24' have been formed, a sacrificial material may be deposited on the sensor and in the gap, and another material 26 may be deposited on the sacrificial material in order to bridge the gap between the cap layers 22 of the respective nano-clusters 24'. The sacrificial material may then be removed to form a bridge between the nano-clusters 24'. FIG. 4 schematically depicts the nano-structures 100' as a nano-filter for gases, whereby a gas stream (identified by the arrows in the figure and labeled "Air") is directed to flow laterally through the nano-pillars 20. Particulates (e.g., particles, cells, colloid particles, etc.) or other matter larger than the spaces between the nano-pillars 20 are selectively removed from the gas stream and are not able to pass through to the sensor. This nano-filter 1000 may advantageously be used in combination with the sensor (schematically shown in FIG. 4) so that the sensor is exposed to the desirable components of the gas stream alone.

To further illustrate embodiment(s) of the present disclosure, examples are given herein. It is to be understood that these examples are provided for illustrative purposes and are not to be construed as limiting the scope of the disclosed embodiment(s).

EXAMPLES

Example 1

Figure 5:
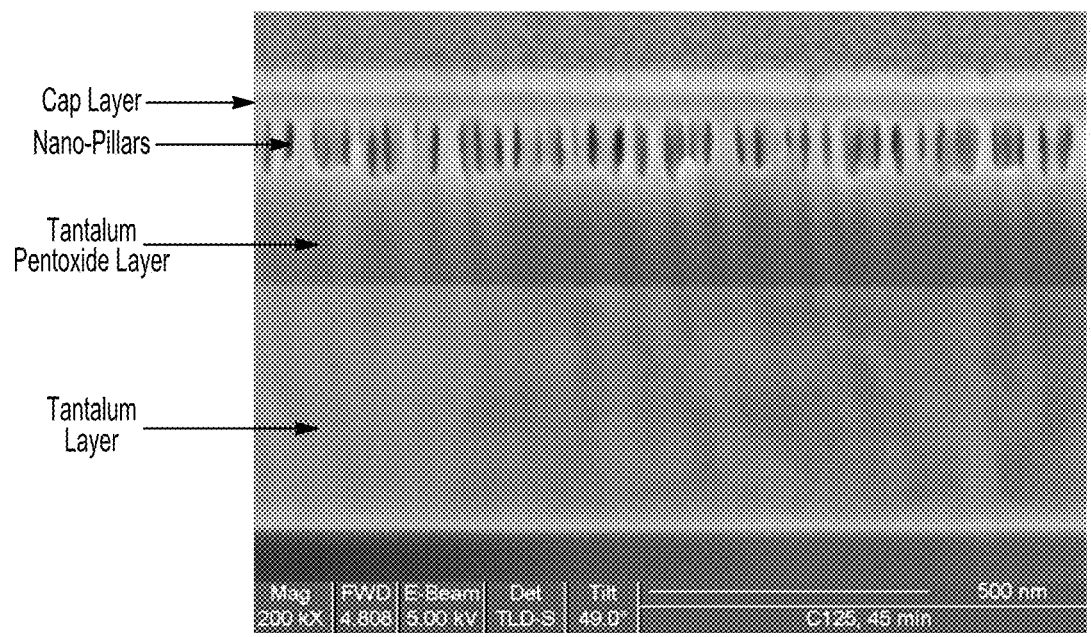
FIG. 5 is a SEM image of a sample of a nano-structure formed by the method according to Example 1 below.

A nano-structure was formed using a multi-layer structure of 100 nm of aluminum on 500 nm of tantalum. The aluminum was anodized in 2% oxalic acid at 30 V to form an alumina template having a thickness of about 130 nm. Tantalum was then anodized in 0.1% citric acid with the voltage up to 200 V to form a tantalum pentoxide layer thickness (which includes the oxide layer 14', the nano-pillars 20, and the cap layer 22) of about 350 nm. The alumina template was removed by etching the template in $H_3PO_4+CrO_3+H_2O$ solution as described above. FIG. 5 illustrates a scanning electron micrograph (SEM) cross-section of a portion of this nano-structure at a 90° tilt.

Example 2

Figure 6:
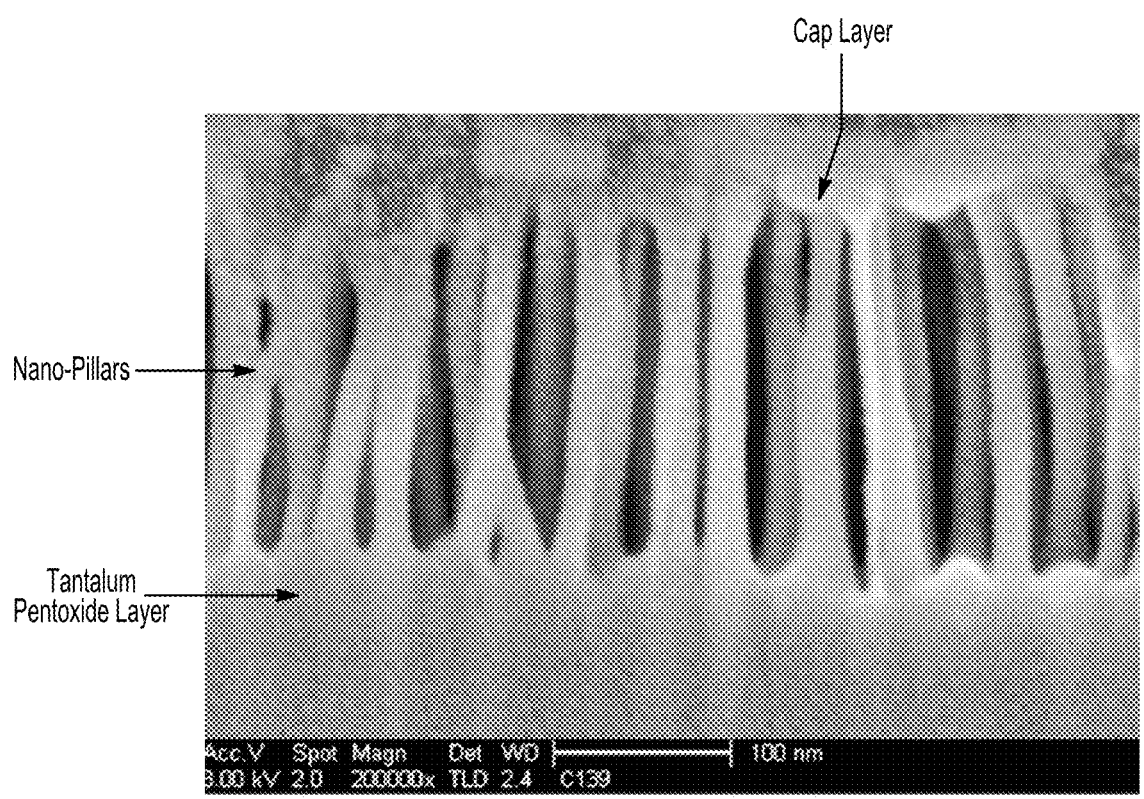
FIG. 6 is a SEM image of yet another sample of a nano-structure formed by the method according to Example 2 below.

A nano-structure was formed using a multi-layer structure of 150 nm of aluminum on 500 nm of tantalum. The aluminum was anodized in 20% sulfuric acid at 15 V to form an alumina template having a thickness of about 195 nm. Tantalum was then anodized in 0.1% citric acid with the voltage up to 200 V to form a tantalum pentoxide layer thickness (which includes the oxide layer 14', the nano-pillars 20, and the cap layer 22) of about 325 nm. The alumina template was removed by etching the template in $H_3PO_4+CrO_3+H_2O$ solution as described above. FIG. 6 illustrates a focused ion beam scanning electron micrograph (FIB-SEM) cross-section of a portion of this nano-structure at a 90° tilt.

While several embodiments have been described in detail, it will be apparent to those skilled in the art that the disclosed embodiments may be modified. Therefore, the foregoing description is to be considered non-limiting.

What is claimed is:
1. A method of forming a nano-structure, comprising:
  forming a multi-layered structure including i) a first oxidizable material layer established on a substrate, and ii) a second oxidizable material layer established on the first oxidizable material layer, the first oxidizable mate- rial layer being formed of a metal layer having an expansion coefficient, during oxidation, that is more than 1;

forming a template out of the second oxidizable material layer, the template including a plurality of pores defined therein;

growing an oxide structure from the first oxidizable material layer through each of the plurality of pores and over a surface of the template, wherein the growing of the oxide structure includes anodizing portions of the metal layer to form an oxide layer on a non-oxidized portion of the metal layer and to grow an individual metal oxide nano-pillar from the oxide layer inside each of the plurality of pores that are oriented in a position that is substantially normal to the substrate, and wherein the growing of the oxide structure over the surface of the template includes merging respective end portions of the individual metal oxide nano-pillars to form a continuous metal oxide cap layer; and selectively removing the template to expose the plurality of metal oxide nano-pillars and to form a space defined between adjacent metal oxide nano-pillars;

wherein the continuous metal cap layer is in contact with all of the metal oxide nano-pillars, and is over the plurality of metal oxide nano-pillars and over, but not in, the space between the adjacent metal oxide nano-pillars;

and wherein each of the metal oxide nano-pillars has a diameter ranging from about 10 nm to about 350 nm and a height ranging from about 10 nm to 1000 nm.

2. The method as defined in claim 1 wherein the forming of the template and the growing of the oxide structure are accomplished via anodization using any of oxalic acid, sulfuric acid, phosphoric acid, chromic acid or mixtures thereof as an electrolyte.

3. The method as defined in claim 1 wherein the first oxidizable material is chosen from tantalum, niobium, tungsten, titanium, alloys thereof, and mixtures thereof.

4. The method as defined in claim 1 wherein the forming of the template is accomplished by anodizing the second oxidizable material layer.

5. The method as defined in claim 1 wherein prior to selectively removing the template, the method further comprises patterning the cap layer and the template to form a pre-nano-island, the patterning including selectively removing a portion of the cap layer, a portion of the template, and some of the plurality of individual nano-pillars.

6. The method as defined in claim 1, further comprising tuning at least one of the height, a pitch, the diameter, a gap, or an aspect ratio of the individual nano-pillars by adjusting at least one parameter of an anodizing process utilized to grow the oxide structure, to form the template, or combinations thereof.

7. The method as defined in claim 1, further comprising modifying a surface chemistry of the individual nano-pillars, the cap layer, or combinations thereof, the modifying being accomplished by depositing an other material on a surface of each of the nano-pillars, the cap layer, or combinations thereof.

8. The method as defined in claim 1, further comprising controlling a mass of the nano-structure by adjusting at least one of a thickness of the cap layer or a lateral area of the cap layer.

9. A nano-structure, comprising:
a substrate;
a non-oxidized portion of a metal layer formed on the substrate, the metal layer having an expansion coefficient, during oxidation, that is larger than 1;
an oxide layer formed on the non-oxidized portion of the metal layer;
a plurality of metal oxide nano-pillars grown from the oxide layer, wherein each of the plurality of metal oxide nano-pillars is grown through a plurality of pores defined in a template;
a space defined between adjacent metal oxide nano-pillars; and
a continuous metal oxide cap layer over the plurality of metal oxide nano-pillars and over, but not in, the space between the adjacent metal oxide nano-pillars, the continuous metal oxide cap layer being formed from end portions of the plurality of metal oxide nano-pillars that merge together over a surface of the template, the continuous metal oxide cap layer in contact with all of the metal oxide nano-pillars;
wherein the oxide layer, the plurality of metal oxide nano-pillars, and the metal oxide cap layer are formed from the anodization of portions of the metal layer;
and wherein each of the metal oxide nano-pillars has a diameter ranging from about 10 nm to about 350 nm and a height ranging from about 10 nm to 1000 nm.

10. The nano-structure as defined in claim 9 wherein each of the plurality of metal oxide nano-pillars includes a pitch ranging from about 30 nm to about 500 nm, the height ranging from about 10 nm to about 500 nm, and an aspect ratio that is greater than 10, and wherein a gap between adjacent metal oxide nano-pillars ranges from about 0 nm to about 300 nm.

11. The nano-structure as defined in claim 9 wherein each of the plurality of metal oxide nano-pillars, the continuous metal oxide cap layer, or combinations thereof include a surface modified by a material chosen from aluminum oxide, zirconium oxide, titanium dioxide, silicon dioxide, tungsten oxide, zinc oxide, hafnium oxide, and combinations thereof.

12. The nano-structure as defined in claim 9 wherein the continuous metal oxide cap layer has a thickness that is equal to the space between the adjacent metal oxide nano-pillars.

13. The nano-structure as defined in claim 9 wherein the nano-structure is a micro- or nano-fluidic device.

14. The nano-structure as defined in claim 13 wherein the micro- or nano-fluidic device is for detection of an analyte, or filtration or separation of fluidic media.

15. The nano-structure as defined in claim 9 wherein the non-oxidized portion of the metal layer is tantalum, and wherein the oxide layer, the plurality of metal oxide nano-pillars, and the metal oxide cap layer are tantalum pentoxide.

16. The nano-structure as defined in claim 9 wherein:
the non-oxidized portion of the metal layer is tungsten when the metal layer is tungsten, niobium when the metal layer is niobium, or titanium when the metal layer is titanium; and
the oxide layer, the metal oxide nano-pillars, and metal oxide cap layer are tungsten oxide when the metal layer is tungsten, niobium oxide when the metal layer is niobium, or titanium oxide when the metal layer is titanium.

17. A nano-structure, consisting of:
a substrate;
one tantalum metal layer; and
an oxide structure formed on and from the one tantalum metal layer, the oxide structure including:
an oxide layer;
a plurality of metal oxide nano-pillars formed on the oxide layer, wherein each of the plurality of metal oxide nano-pillars is grown through a plurality of pores defined in a template;
a space defined between adjacent metal oxide nano-pillars; and a continuous metal oxide cap layer over the plurality of nano-pillars and over, but not in, the space between the adjacent metal oxide nano-pillars, the continuous metal oxide cap layer being formed from end portions of the plurality of metal oxide nano-pillars that merge together over a surface of the template, the continuous metal oxide cap layer in contact with all of the metal oxide nano-pillars;

wherein the oxide layer, the plurality of metal oxide nano-pillars, and the metal oxide cap layer are tantalum pentoxide formed from the anodization of the one tantalum metal layer;

and wherein each of the metal oxide nano-pillars has a diameter ranging from about 10 nm to about 350 nm and a height ranging from about 10 nm to 1000 nm.

* * * * *